United States Patent
Chung et al.

(10) Patent No.: US 8,910,644 B2
(45) Date of Patent: Dec. 16, 2014

(54) METHOD AND APPARATUS FOR INDUCING TURBULENT FLOW OF A PROCESSING CHAMBER CLEANING GAS

(75) Inventors: Hua Chung, San Jose, CA (US); Xizi Dong, Santa Clara, CA (US); Kyawwin Jason Maung, Daly City, CA (US); Hiroji Hanawa, Sunnyvale, CA (US); Sang Won Kang, San Jose, CA (US); David H. Quach, San Jose, CA (US); Donald J. K. Olgado, Palo Alto, CA (US); David Bour, Cupertino, CA (US); Wei-Yung Hsu, San Jose, CA (US); Alexander Tam, Union City, CA (US); Anzhong Chang, San Jose, CA (US); Sumedh Acharya, Pune (IN)

(73) Assignee: Applied Materials, Inc., Santa Clara, CA (US)

(*) Notice: Subject to any disclaimer, the term of this patent is extended or adjusted under 35 U.S.C. 154(b) by 878 days.

(21) Appl. No.: 13/041,230

(22) Filed: Mar. 4, 2011

(65) Prior Publication Data

US 2011/0308551 A1 Dec. 22, 2011

Related U.S. Application Data

(60) Provisional application No. 61/356,422, filed on Jun. 18, 2010.

(51) Int. Cl.
*B08B 3/02* (2006.01)
*B08B 5/00* (2006.01)
(Continued)

(52) U.S. Cl.
CPC .............. *B08B 5/00* (2013.01); *C23C 16/4405* (2013.01); *C23C 16/45506* (2013.01); *C23C 16/45591* (2013.01); *H01L 21/02041* (2013.01); *H01L 21/67115* (2013.01); *Y10S 438/905* (2013.01)
USPC ...... 134/117; 134/119; 156/345.34; 118/715; 438/905

(58) Field of Classification Search
CPC ..................... C23C 16/4405; C23C 16/45565; C23C 16/4558; C23C 16/4582; B08B 3/02
USPC .................. 134/117, 119, 123, 201; 118/715; 438/905; 156/345.34
See application file for complete search history.

(56) References Cited

U.S. PATENT DOCUMENTS

D320,361 S  10/1991 Karasawa
6,277,235 B1  8/2001 Wing et al.
(Continued)

FOREIGN PATENT DOCUMENTS

JP   2005-072291 A   3/2005

OTHER PUBLICATIONS

Japanese Office Action dated Feb. 21, 2012 for Japanese Application No. 2011-019695.
(Continued)

*Primary Examiner* — Saeed T Chaudhry
(74) *Attorney, Agent, or Firm* — Patterson & Sheridan, LLP

(57) ABSTRACT

Embodiments of the invention generally relate to apparatus and methods for cleaning chamber components using a cleaning plate. The cleaning plate is adapted to be positioned on a substrate support during a cleaning process, and includes a plurality of turbulence-inducing structures. The turbulence-inducing structures induce a turbulent flow of cleaning gas while the cleaning plate is rotated during a cleaning process. The cleaning plate increases the retention time of the cleaning gas near the showerhead during cleaning. Additionally, the cleaning plate reduces concentration gradients within the cleaning plate to provide a more effective clean. The method includes positioning a cleaning plate adjacent to a showerhead, and introducing cleaning gas to the space between the showerhead and the cleaning plate. A material deposited on the surface of the showerhead is then heated and vaporized in the presence of the cleaning gas, and then exhausted from the processing chamber.

14 Claims, 7 Drawing Sheets

(51) Int. Cl.
*C23C 16/44* (2006.01)
*C23C 16/455* (2006.01)
*H01L 21/02* (2006.01)
*H01L 21/67* (2006.01)

(56) References Cited

U.S. PATENT DOCUMENTS

| | | | |
|---|---|---|---|
| 7,087,122 B2* | 8/2006 | Smith et al. | 134/33 |
| 7,431,772 B2 | 10/2008 | Murugesh et al. | |
| 2002/0020429 A1 | 2/2002 | Selbrede et al. | |
| 2003/0173029 A1* | 9/2003 | Saito et al. | 156/345.24 |
| 2007/0051316 A1* | 3/2007 | Ohori et al. | 118/725 |
| 2007/0267528 A1* | 11/2007 | Bisio | 241/91 |
| 2012/0064727 A1* | 3/2012 | Oh et al. | 438/745 |

OTHER PUBLICATIONS

International Search Report dated Feb. 9, 2012, Application No. PCT/US2011/040197.

Taiwan Office Action dated Feb. 17, 2012 for Taiwan Design Patent Application No. 100304292.

* cited by examiner

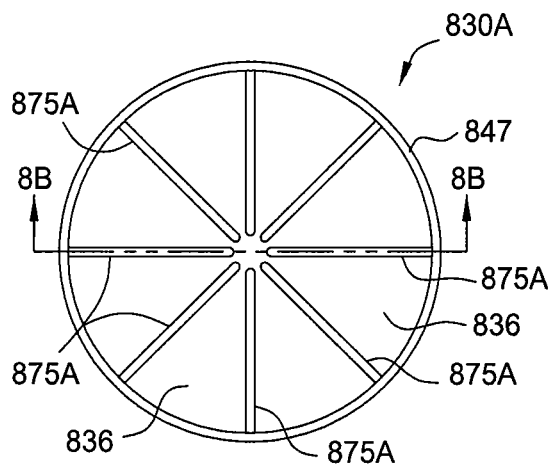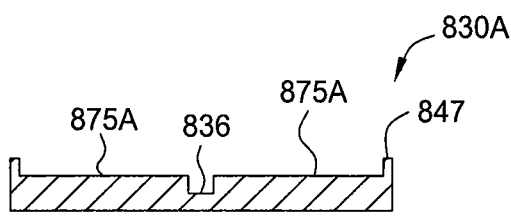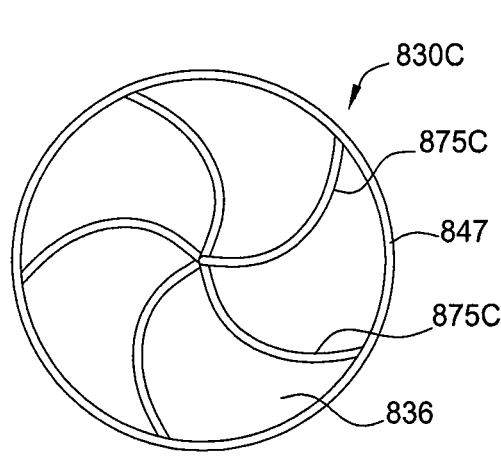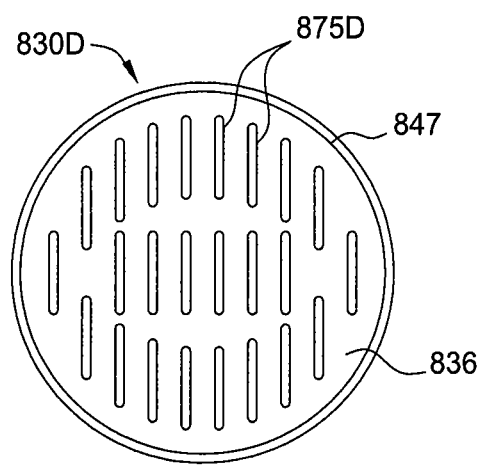
FIG. 8A
FIG. 8B
FIG. 8C
FIG. 8D

METHOD AND APPARATUS FOR INDUCING TURBULENT FLOW OF A PROCESSING CHAMBER CLEANING GAS

CROSS-REFERENCE TO RELATED APPLICATIONS

This application claims benefit of U.S. Provisional Patent Application Ser. No. 61/356,422, filed Jun. 18, 2010, which is herein incorporated by reference.

GOVERNMENT RIGHTS IN THIS INVENTION

This invention was made with Government support under DE-EE0003331 awarded by DOE. The Government has certain rights in this invention.

BACKGROUND OF THE INVENTION

1. Field of the Invention

Embodiments of the invention generally relate to methods and apparatus for cleaning a showerhead used in a chemical vapor deposition process.

2. Description of the Related Art

Group III-V films are finding greater importance in the development and fabrication of a variety of semiconductor devices, such as short wavelength light emitting diodes (LEDs), laser diodes (LDs), and electronic devices including high power, high frequency, high temperature transistors and integrated circuits. For example, short wavelength (e.g., blue/green to ultraviolet) LEDs are fabricated using the Group III-nitride semiconducting material gallium nitride. It has been observed that short wavelength LEDs fabricated using GaN can provide significantly greater efficiencies and longer operating lifetimes than short wavelength LEDs fabricated using non-nitride semiconducting materials, such as Group II-VI materials.

One method that has been used for depositing Group III-nitrides, such as GaN, is metal organic chemical vapor deposition (MOCVD). This chemical vapor deposition method is generally performed in a reactor having a temperature controlled environment to assure the stability of a first precursor gas which contains at least one element from Group III, such as gallium. A second precursor gas, such as ammonia, provides the nitrogen needed to form a Group III-nitride. The two precursor gases are injected into a processing zone within the reactor where they mix and move towards a heated substrate in the processing zone. A carrier gas may be used to assist in the transport of the precursor gases towards the substrate. The precursors react at the surface of the heated substrate to form a Group III-nitride layer, such as GaN, on the substrate surface. The quality of the film depends in part upon deposition uniformity which, in turn, depends upon uniform mixing of the precursors across the substrate.

Multiple substrates may be arranged on a substrate carrier and each substrate may have a diameter ranging from 50 millimeters to 100 millimeters or larger. The uniform mixing of precursors over larger substrates and/or more substrates and larger deposition areas is desirable in order to increase yield and throughput. These factors are important since they directly affect the cost to produce an electronic device and, thus, a device manufacturer's competitiveness in the marketplace.

Interaction of the precursor gases with the hot hardware components, which are often found in the processing zone of a reactor, generally causes the precursor to break-down and deposit on these hot surfaces. Typically, the reactor surfaces are heated by radiation from the heat sources used to heat the substrates. The deposition of the precursor materials on the hot surfaces can be especially problematic when it occurs in or on the precursor distribution components, such as the showerhead. Deposition on the precursor distribution components affects the flow distribution uniformity over time, which may have a negative impact on the quality of processed substrates. Therefore, there is a need for a method and apparatus for cleaning or removing the deposited precursor material from chamber components, such as a showerhead.

SUMMARY OF THE INVENTION

Embodiments of the invention generally relate to apparatus and methods for cleaning chamber components using a cleaning plate. The cleaning plate is adapted to be positioned on a substrate support during a cleaning process, and includes a circular ring, a central hub, and a plurality of turbulence-inducing structures extending between the circular ring and the central hub. The turbulence-inducing structures induce a turbulent flow of cleaning gas while the cleaning plate is rotated during a cleaning process. The cleaning plate increases the retention time of the cleaning gas near the showerhead during cleaning. Additionally, the cleaning plate reduces concentration gradients within the cleaning gas located between the cleaning plate and the showerhead to provide a more efficient clean. The method includes positioning a cleaning plate adjacent to a showerhead. The cleaning plate includes a circular ring and a central hub, and a plurality of turbulence-inducing structures extending from the central hub and connected to the circular ring. A cleaning gas is then introduced into the space between the showerhead and the cleaning plate. The cleaning plate is rotated, and the turbulence-inducing structures of the cleaning plate agitate the cleaning gas. A material deposited on the surface of the showerhead is then heated and reacts to form a volatile compound which is then exhausted from the processing chamber.

In one embodiment, an apparatus for inducing turbulent flow within a processing chamber comprises a circular ring and a central hub. The central hub is located within the same plane as the circular ring. A first set of turbulence-inducing structures extend from the central hub to the circular ring. Openings are located between each turbulence-inducing structure of the first set of turbulence-inducing structures.

In another embodiment, an apparatus includes a plate-like body of optically transparent material, and a ring disposed around a periphery of the plate-like body. A plurality of turbulence-inducing structures are formed on a surface of the plate-like body.

In another embodiment, a method for cleaning a showerhead includes positioning a cleaning plate on a substrate support disposed within a processing chamber. The cleaning plate comprises a plurality of turbulence-inducing structures. The cleaning plate is then positioned adjacent to a showerhead disposed in the processing chamber. Deposition material disposed on a surface of the showerhead is heated, and a cleaning gas is introduced into a location between a surface of the showerhead and the cleaning plate. The cleaning plate is then rotated, and the deposition material is vaporized. The vaporized material is then exhausted from the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 8A-8G are schematic views of cleaning plates according to other embodiments of the invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to apparatus and methods for cleaning chamber components using a cleaning plate. The cleaning plate is adapted to be positioned on a substrate support during a cleaning process, and includes a circular ring, a central hub, and a plurality of turbulence-inducing structures extending between the circular ring and the central hub. The turbulence-inducing structures induce a turbulent flow of cleaning gas while the cleaning plate is rotated during a cleaning process. The cleaning plate increases the retention time of the cleaning gas near the showerhead during cleaning. Additionally, the cleaning plate reduces concentration gradients within the cleaning gas located between the cleaning plate and the showerhead to provide a more efficient clean. The method includes positioning a cleaning plate adjacent to a showerhead. The cleaning plate includes a circular ring and a central hub, and a plurality of turbulence-inducing structures extending from the central hub and connected to the circular ring. A cleaning gas is then introduced into the space between the showerhead and the cleaning plate. The cleaning plate is rotated, and the turbulence-inducing structures of the cleaning plate agitate the cleaning gas. A material deposited on the surface of the showerhead is then heated and reacts to form a volatile compound which is then exhausted from the processing chamber.

Exemplary MOCVD chambers which may benefit from embodiments herein are described in U.S. patent application Ser. No. 12/023,520, filed Jan. 31, 2008, published as U.S. Patent Application Publication No. 2009-0194024, and titled CVD APPARATUS. It is contemplated that other chambers may also benefit from embodiments described herein.

Figure 1:
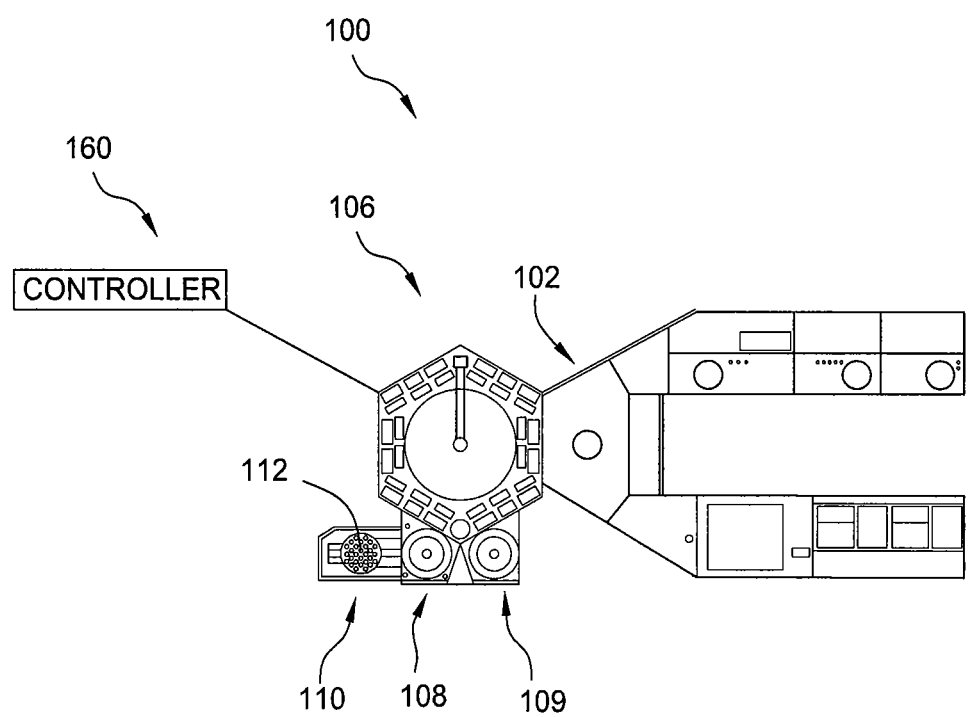
FIG. 1 is a schematic plan view illustrating one embodiment of a processing system for fabricating compound nitride semiconductor devices.

FIG. 1 is a schematic plan view illustrating one embodiment of a processing system 100 that comprises an MOCVD chamber 102 for fabricating compound nitride semiconductor devices. The processing system 100 is closed to atmosphere and comprises a transfer chamber 106, an MOCVD chamber 102 coupled with the transfer chamber 106, and a loadlock chamber 108 coupled with the transfer chamber 106. A batch loadlock chamber 109, capable of storing substrates, is coupled with the transfer chamber 106, and a load station 110, capable of loading substrates, is coupled with the loadlock chamber 108. The transfer chamber 106 comprises a robot assembly (not shown) operable to pick up and transfer substrates between the loadlock chamber 108, the batch loadlock chamber 109, and the MOCVD chamber 102. Although a single MOCVD chamber 102 is shown, more than one MOCVD chamber may be coupled with the transfer chamber 106. Additionally, one or more Hydride Vapor Phase Epitaxial (HVPE) chambers may also be coupled with the transfer chamber 106.

In the processing system 100, the robot assembly (not shown) transfers a carrier plate 112 loaded with substrates into the MOCVD chamber 102 to undergo deposition. The carrier plate 112 generally has a diameter ranging from about 200 millimeters to about 750 millimeters, and may support between about 1 and about 50 substrates during processing. The carrier plate 112 is formed from SiC; however, the carrier plate 112 may alternatively be formed from SiC-coated graphite.

After the desired deposition steps have been completed in the MOCVD chamber 102, the carrier plate 112 is transferred from the MOCVD chamber 102 back to the transfer chamber 106 via the transfer robot. The carrier plate 112 can then be transferred to the loadlock chamber 108 or the batch loadlock chamber 109. A system controller 160 controls activities and operating parameters of the processing system 100. The system controller 160 includes a computer processor and a computer-readable memory coupled to the processor. The processor executes system control software, such as a computer program stored in memory.

Figure 2:
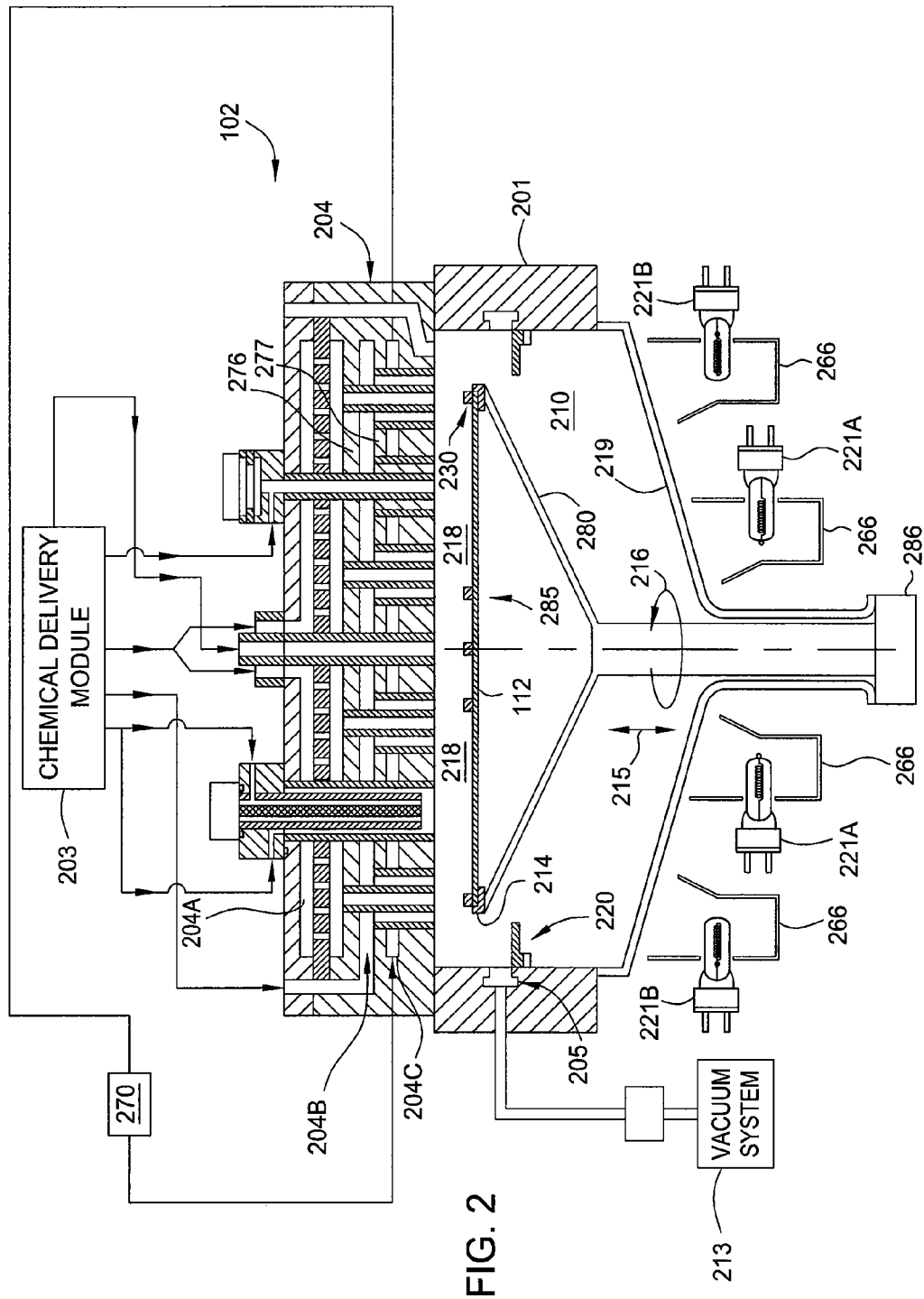
FIG. 2 is a schematic sectional view of an MOCVD chamber and a cleaning plate according to an embodiment of the invention.

FIG. 2 is a schematic cross-sectional view of an MOCVD chamber. The MOCVD chamber 102 has a chamber body 201 and showerhead assembly 204 coupled thereto. A chemical delivery module 203 is coupled to the showerhead assembly 204 for delivering precursor gases, carrier gases, cleaning gases, and/or purge gases to the processing region 218. A vacuum system 213 is coupled to the processing region 218 to remove gases therefrom. A substrate support 214 (shown in an elevated cleaning positioned) is disposed in an internal region of the MOCVD chamber 102 opposite the showerhead assembly 204 and between the processing region 218 and the lower volume 210. The substrate support 214 is positioned on support posts 280 which are connected to a rotatable support shaft. The substrate support 214 has an annular shape with an opening 285 disposed therethrough to allow radiant energy from lamps 221A, 221B to contact a carrier plate 112 positioned on the substrate support 214. The carrier plate 112 is formed from silicon carbide or another high emissivity material to absorb radiant energy from inner lamps 221A and outer lamps 221B. A cleaning plate 230 is positioned on the upper surface of the carrier plate 112 adjacent to the showerhead assembly 204.

An actuator assembly 286 is capable of moving the substrate support 214 in a vertical direction towards or away from the showerhead assembly 204, as shown by arrow 215, and capable of rotating the substrate support 214, as shown by arrow 216. A ring 220 is disposed around the internal surface of the chamber body 201 to help prevent deposition from occurring in the lower volume 210 and also help direct exhaust gases from the MOCVD chamber 102 to the exhaust ports 205. A lower dome 219 is disposed beneath the substrate support 214. The lower dome 219 is made of transparent material, such as high-purity quartz, to allow light from inner lamps 221A and outer lamps 221B to pass through for radiant heating of the carrier plate 112. Reflectors 266 are used to help control exposure of the MOCVD chamber 102 to the radiant energy provided by the inner lamps 221A and outer lamps 221B.

The chemical delivery module 203 supplies chemicals to the MOCVD chamber 102. Reactive gases, carrier gases, purge gases, and cleaning gases may be supplied from the chemical delivery module 203 through supply lines and into the MOCVD chamber 102. The showerhead assembly 204 includes a first processing gas channel 204A, a second process gas channel 204B, and a temperature control channel 204C coupled with a heat exchanging system 270. Horizontal walls 276 and 277 separate channels 204A-204C. The first process gas channel 204A and the second process gas channel 204B provide process gases to the processing region 218 via independent channels, thus reducing the amount of undesired deposition occurring within the showerhead assembly 204. The heat exchanging system 270 is adapted to regulate the temperature of the showerhead assembly 204. Suitable heat exchanging fluids include, but are not limited to, water, water-based ethylene glycol mixtures, a perfluoropolyether (e.g., GALDEN® fluid), oil-based thermal transfer fluids such as mineral oil, or similar fluids. The heat exchanging system 270 is adapted to regulate the temperature of the showerhead assembly 204 within a range from about 50 degrees Celsius to about 200 degrees Celsius, for example, within a range of about 115 degrees Celsius to about 150 degrees Celsius.

Figure 3:
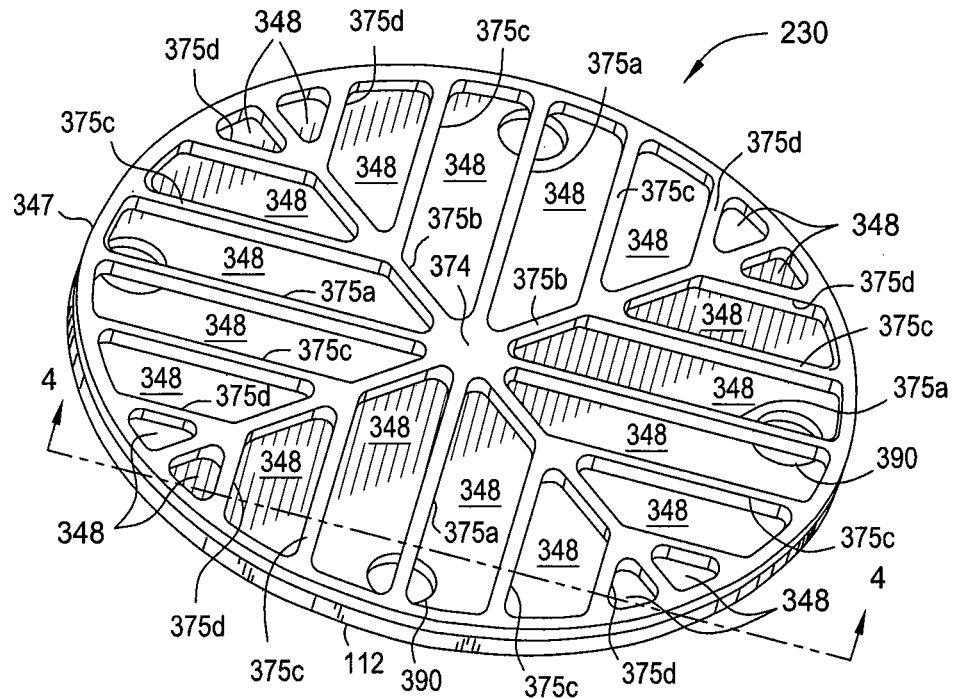
FIG. 3 is a top perspective view of the cleaning plate and carrier plate shown in FIG. 2.

FIG. 3 illustrates a schematic top perspective view of the cleaning plate 230 and the carrier plate 112. The cleaning plate 230 is positioned on the upper surface of the carrier plate 112 which faces a showerhead assembly during processing. The cleaning plate 230 includes a central hub 374 from which turbulence-inducing structures 375a and 375b extend. The turbulence-inducing structures 375a and 375b are co-planar with and connected to the interior edge of the circular ring 347. Adjacent turbulence-inducing structures 375a are positioned about 90 degrees from one another, while adjacent turbulence-inducing structures 375b are also positioned about 90 degrees apart. The turbulence-inducing structures 375b have additional turbulence-inducing structures 375c and 375d extending therefrom and connected with the interior edge of the circular ring 347. The turbulence-inducing structures 375c and 375d are connected to the turbulence-inducing structures 375b at angles of about 45 degree.

The cleaning plate 230 includes openings 348 between each of the turbulence-inducing structures 375a-375d which form pockets defined by the upper surface of the carrier plate 112 and the sidewalls of the turbulence-inducing structures 375a-375d. During processing, each of the pockets can contain a cleaning gas near the showerhead assembly surface when positioned adjacent to the showerhead assembly in a cleaning position, thus increasing the retention time of the cleaning gas near the showerhead assembly. The cleaning plate 230 is maintained on the carrier plate 112 by footings which extend from the bottom of the cleaning plate 230 into the substrate carrier pockets 390 formed in the upper surface of the carrier plate 112. The cleaning plate 230 has a height within a range from about 3 to about 10 millimeters, for example, about 7 millimeters. The cleaning plate 230 has a diameter within a range of about 300 millimeters to about 400 millimeters. However, it is contemplated that the cleaning plate may be larger or smaller depending on the size of the processing chamber in which it is to be used. The cleaning plate 230 is formed from quartz, but may alternatively be formed from silicon carbide or another material which is substantially non-reactive with the cleaning gases supplied to the processing chamber.

The carrier plate 112 generally has the same diameter as the cleaning plate 230 so that equipment used to transport the carrier plate 112 is also capable of handling the cleaning plate 230. Additionally, when the carrier plate 112 and the cleaning plate 230 each have a sufficient thickness, it is contemplated that the cleaning plate 230 can be transferred through the processing system simultaneously with the carrier plate 112, thus eliminating the need for two separate transportation steps.

Figure 4:
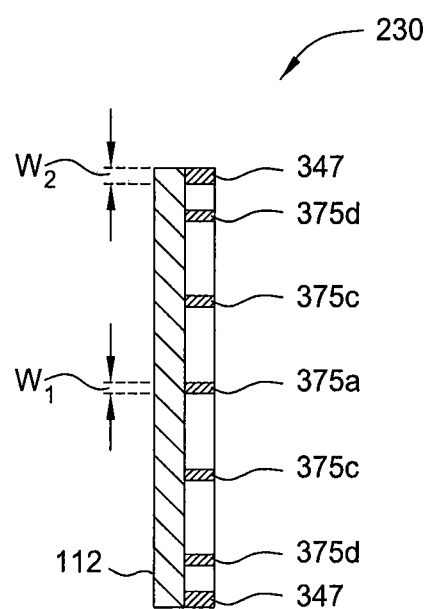
FIG. 4 is a sectional view along section 4-4 of the cleaning plate and carrier plate shown in FIG. 3.

FIG. 4 is a sectional view of the cleaning plate 230 and the carrier plate 112 along section line 4-4 shown in FIG. 3. The turbulence-inducing structures 375a-375d have a rectangular cross section and a width $W_1$ within a range from about 4 millimeters to about 8 millimeters, for example, about 6 millimeters. Additionally, the ring 347 has a width $W_2$ within a range of about 8 millimeters to about 14 millimeters. It is contemplated that the turbulence-inducing structures 375a-375d and the ring 347 may have larger or smaller widths depending on application requirements.

Figure 5:
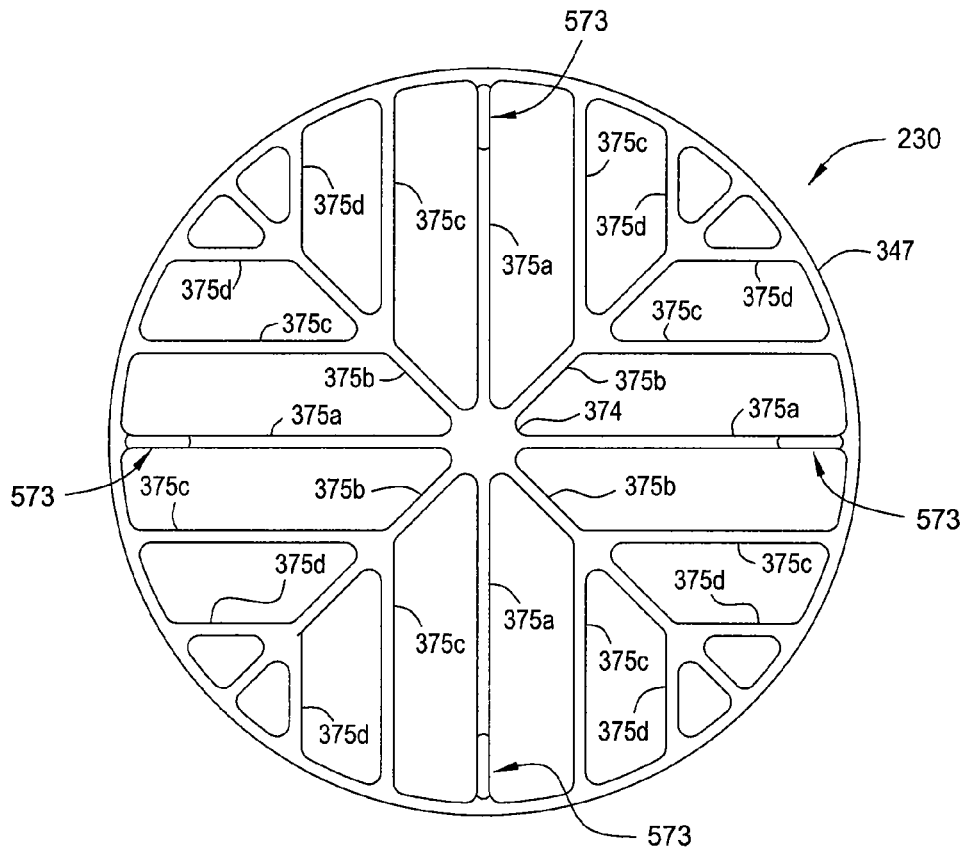
FIG. 5 is a bottom plan view of the cleaning plate of FIG. 2.

FIG. 5 is a bottom plan view of the cleaning plate 230. The cleaning plate 230 includes four footings 573 which extend outward from the bottom surface of the cleaning plate 230. The footings 573 have rounded ends and are sized to fit within substrate pockets formed within a carrier plate on which the cleaning plate 230 is positioned during a cleaning process. The footings 573 are adapted to prevent the cleaning plate 230 from sliding laterally across the top surface of the carrier plate 112 during rotation of the cleaning plate 230 and the carrier plate 112. The footings 573 extend from the lower surface of the cleaning plate 230 about 0.25 millimeters to about 1 millimeter. For example, the footings 573 may extend about 0.33 millimeters from the lower surface of the cleaning plate 230. Although the cleaning plate 230 is shown as having four footings 573, it is contemplated that more or less than four footings 573 may extend from the lower surface of the cleaning plate 230, as long as sufficient lateral support is provide. Furthermore, it is contemplated that the footings 573 may extend from any of the turbulence-inducing structures 375a-375d or the central hub 374, and that placement of the footings 573 generally depends on the placement of substrate carrier pockets within a substrate carrier. Alternatively, it is contemplated that the cleaning plate 230 may lack the footings 573, and may instead be glued, bonded, or otherwise secured to the carrier plate 112 to prevent lateral movement thereof.

Figure 6:
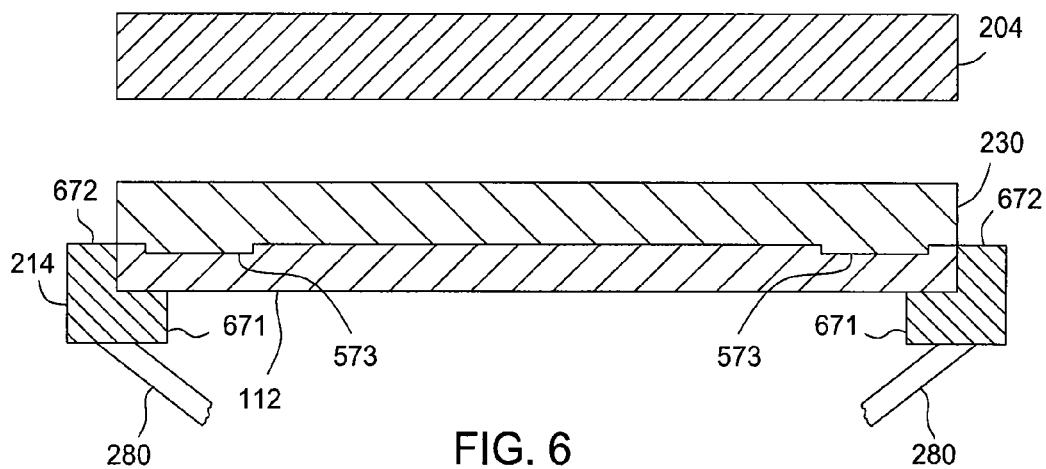
FIG. 6 is a schematic sectional view of a showerhead assembly and a cleaning plate positioned on a carrier plate.

FIG. 6 is a schematic sectional view of a showerhead assembly 204 and a cleaning plate 230 positioned on a carrier plate 112. The carrier plate 112 is positioned on a substrate support 214. The cleaning plate 230 is positioned on the carrier plate 112 and supported on footings 573 extending from the bottom surface of the cleaning plate 230. The footings 573 are positioned within substrate carrier pockets formed within the carrier plate 112. The footings 573 are sized to prevent lateral movement of the cleaning plate 230 across the carrier plate 112 while being moved adjacent to the showerhead assembly 204 during a cleaning process. The footings 573 have a sufficient size to prevent undesired lateral movement of the cleaning plate 230; however, the footings 573 should generally not be so large as to prevent separation of the cleaning plate 230 from the substrate carrier plate 112 when desired. It is contemplated that the size of the footings 573 may take into consideration thermal expansion of both the footings 573 and the carrier plate 112. It is to be noted that the substrate carrier pockets formed within the carrier plate 112 are the same substrate carrier pockets used to support a substrate during a deposition process, such as an MOCVD process.

The carrier plate 112 is disposed on a lower lip 671 of the substrate support 214, which is positioned on posts 280. The carrier plate 112 is prevented from sliding laterally during rotation of the substrate support 214 by the upper lip 672 of the substrate support 214. The upper lip 672 is perpendicular to the lower lip 671 and has inner diameter sized to accommodate the carrier plate 112. While the upper lip 672 is shown as having a top surface approximately level with the top surface carrier plate 112, it is contemplated that the upper lip 672 may extend vertically above the top surface of the carrier plate 112 and provide additional lateral support to the cleaning plate 230. In such an embodiment, the footings 573 may be unnecessary.

Figure 7:
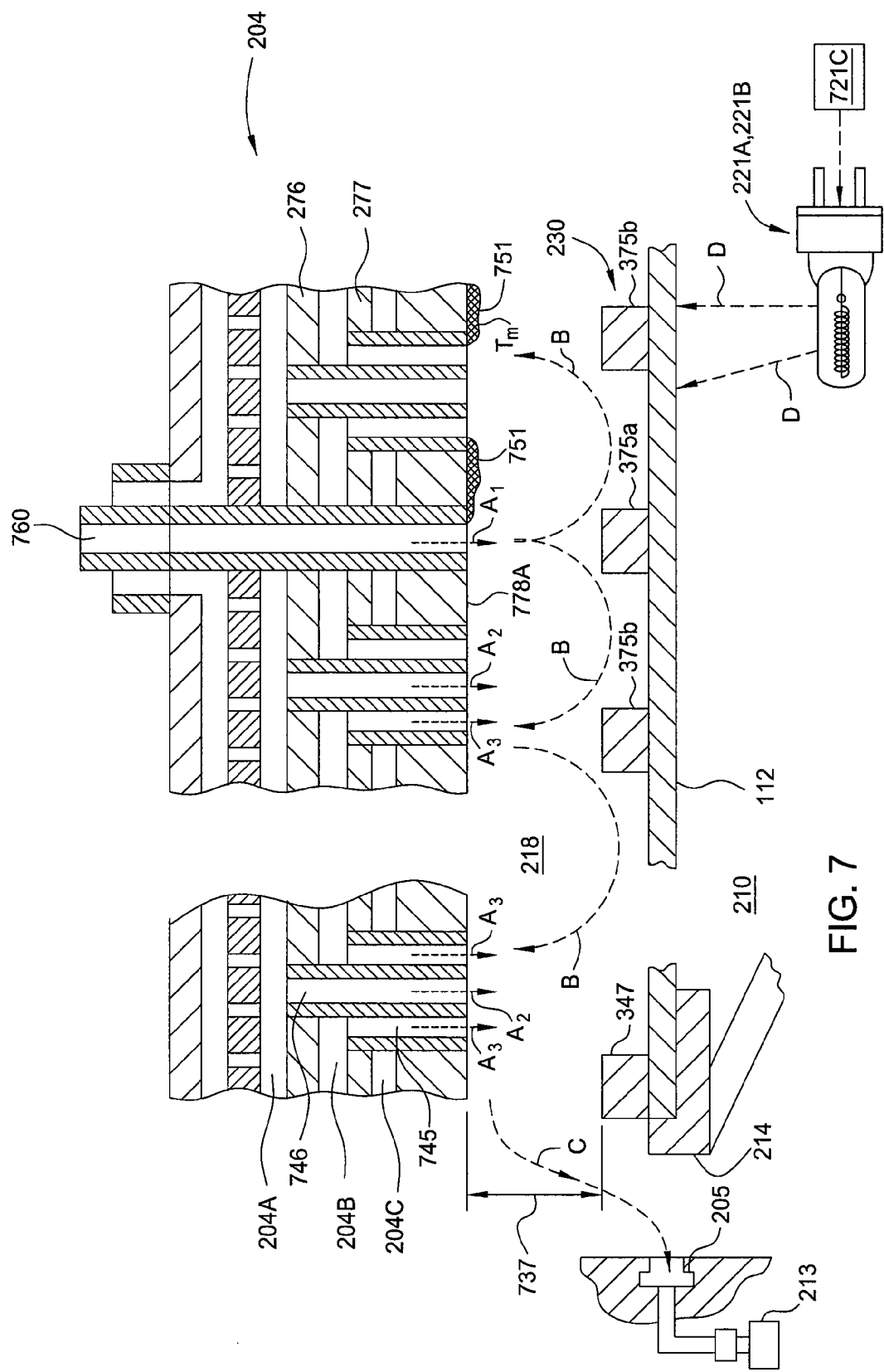
FIG. 7 is an enlarged schematic view of the showerhead assembly and the cleaning plate shown in FIG. 2.

FIG. 7 is an enlarged schematic view of the showerhead assembly 204 and the cleaning plate 230 shown in FIG. 2. The cleaning plate 230 is positioned in an elevated cleaning position for removal of deposited material 751. The deposited material 751 is material which accumulates on the showerhead surface during a deposition process, such as an MOCVD process. For example, deposited material 751 may be indium gallium nitride, p-doped or n-doped gallium nitride, aluminum nitride, or aluminum gallium nitride.

The elevated cleaning position forms a gap 737 between the upper surface of the ring 347 of the cleaning plate 230 and the lower surface of the showerhead assembly 204. Gap 737 is maintained at a distance such that a minimal amount of cleaning gas passes therethrough during the cleaning process, however, the gap is large enough to prevent inadvertent contact between the ring 347 and showerhead surface 778A. Preferably, the internal diameter of the ring 347 is as large as or slightly larger than the deposition area of the showerhead assembly 204. The term deposition area as used herein refers to the area upon which deposited material 751 may deposit or accumulate on the showerhead surface 778A.

Once the cleaning plate 230 has been positioned in the elevated cleaning positioning, power is applied to the inner lamps 221A and outer lamps 221B from the power source 721C to heat the carrier plate 112 with radiant energy D, which thereby heats deposited material 751 to a temperature $T_m$ via radiation and/or convection. Preferably, temperature $T_m$ is sufficiently high to cause sublimation or vaporization of deposited material 751 after deposited material 751 has been contacted with a cleaning gas. In one example, the temperature $T_m$ is about 700 degrees Celsius.

The wavelengths of radiant energy D delivered from the lamps 221A, 221B may be selected to enhance the cleaning process. The wavelengths of light are in the ultraviolet (UV) spectrum, but it is contemplated that infrared (IR) spectrums of light may also be used. The amount of power applied by power source 721C, as well as the wave lengths of light generated by the lamps 221A, 221B, depends upon the composition of the deposited material 751, the pressure of the chamber, the cleaning gas to be applied, and the temperature of the chamber components, among other factors.

Subsequent to or during the heating of the deposited material 751, a cleaning gas is delivered to the processing region 218 through the cleaning gas inlet 760 along flow paths $A_1$. It is contemplated that cleaning gas may also be introduced to the processing region 218 along flow paths $A_2$ via the inner gas conduits 746, or through the outer gas conduits 745 along flow paths $A_3$. With cleaning gas present in processing region 218, the substrate support 214 and the cleaning plate 230 are rotated. Generally, the substrate support 214 and the cleaning plate 230 are rotated at a rate of about 20 revolutions per minute to about 100 revolutions per minute, for example, about 35 revolutions per minute or about 60 revolutions per minute.

The rotation of the turbulence-inducing structures 375a-375d (only 375a and 375b are shown) causes a turbulent flow of the cleaning gas as indicated by turbulence lines B. The cleaning gas enters the processing region 218 as described above, is reflected off the cleaning plate 230 and/or the carrier plate 112, and is mixed by turbulence-inducing structures 375a-375d. The cleaning gas is then directed back towards the showerhead surface 778A as shown by turbulence lines B. As the cleaning gas is reflected off the carrier plate 112, which is being heated by lamps 221A, 221B, the temperature of the cleaning gas is increased which assists in heating the material deposits 751 and promotes vaporization of the material deposits 751.

The turbulence along lines B increases the amount of contact between the cleaning gas and the deposited material 751 on the showerhead surface 778A. In addition, the turbulence along lines B induces mixing of the cleaning gas within the processing region 218 to reduce the concentration gradient of the cleaning gas between the showerhead assembly 204 and the cleaning plate 230. Concentration gradients occur due to the reaction (and thus depletion) of the cleaning gas near the material deposit 751 when the cleaning gas reacts to form a volatile component. Reduction of the concentration gradient (e.g., a more uniform concentration of cleaning gas in the processing region 218) is generally desirable since the reaction rate of the cleaning gas and the deposited material increases due to fresh cleaning gas being constantly circulated to the showerhead surface 778A. Furthermore, a reduction in the concentration gradient is also desirable since it reduces the probability of unused cleaning gas being exhausted through the exhaust port 205 prior to reacting with the material deposits 751. Since cleaning gas is continuously being removed from the processing region 218 along the flow path C during the cleaning process, it is desirable to at least partially react the cleaning gas with the material deposits 751 prior to exhausting in order to avoid wasting the unused cleaning gas.

In one example, the cleaning gas supplied to the processing region 218 is chlorine gas, and the deposited material is a gallium-containing material such as indium gallium nitride. It is contemplated that other cleaning gases may be used, including fluorine ($F_2$) gas, bromine ($Br_2$) gas, iodine ($I_2$) gas, hydrogen iodide (HI), hydrogen chloride (HCl), hydrogen bromide (HBr), hydrogen fluoride (HF), nitrogen trifluoride ($NF_3$), and/or other similar gases. It is also contemplated that other materials may be removed, including gallium nitride, or aluminum gallium nitride. The cleaning gas may be introduced to the processing region 218 at a concentration within a range from about 5 percent to about 50 percent, for example, about 30 percent. The remainder of the gas provided to the chamber may be an inert gas, such as argon. Using vacuum system 213, the pressure within the chamber can be reduced to a range within about $1 \times 10^{-6}$ Torr to about 200 Torr, such as about 5 Torr to about 200 Torr. Preferably, the pressure is about 50 Torr. The flow rate of chlorine gas into the processing region 218 is within a range from about 2 SLM to about 10 SLM. For example, about 4 SLM of chlorine gas may be provided to the processing region 218 during a cleaning process.

The effect of a cleaning gas in the processing region 218 depends upon multiple factors, including but not limited to the temperature and partial pressure of the cleaning gas, the type of cleaning gas used, the temperature of the deposited material 751, the pressure within the processing region 218, and the amount of deposited material 751 present. Preferably, process parameters such as temperature, partial pressure, and the composition of the cleaning gas are adjusted to cause the deposited material 751 to react with the cleaning gas to form a volatile component that will be vaporized. Generally, the vaporization point of the deposited material 751 is known, therefore, the process parameters can be adjusted or selected to cause vaporization of the deposited material 751. Vaporization and removal of the deposited material 751 can be effected by contacting the deposited material 751 with a cleaning gas, increasing the temperature of the deposited material 751 with lamps 221A and 221B, and/or reducing the pressure of the processing region 218 with vacuum system 213.

It should also be noted that the pressure within the processing region 218 and the density of the cleaning gas also affect the removal rate of the deposited material 751. Lowering the pressure within the processing region 218 lowers the vaporization temperature of the deposited material 751, and also results in a molecular flow of the cleaning gas leading to a reduced number of reactions per unit volume. Increasing the pressure within the processing region 218 leads to a viscous flow of the cleaning gas, resulting in more reactions per unit volume but also increasing the vaporization temperature of the deposited material 751. However, cleaning plate 230 creates a turbulent flow of cleaning gas within the processing region 218, which increases the efficiency of the cleaning gas (e.g., increased cleaning gas reactions). Therefore, even when using a reduced pressure which may result in a molecular flow of cleaning gas, such as $1 \times 10^{-6}$ Torr, the cleaning gas atoms can be mixed and directed back towards the deposited material 751 by turbulence-inducing structures 375a-375d. Therefore, the cleaning plate 230 allows a cleaning gas to be utilized in a molecular flow state (allowing the vaporization temperature of the material deposits 751 to be decreased), while providing sufficient cleaning gas reactions through turbulent movement of the cleaning gas. Thus, the cleaning plate 230 promotes more effective cleaning when using reduced pressures.

Without the turbulent mixing provided by the turbulence-inducing structures 375a-375d and rotation of the cleaning plate 230, the reaction between the deposited material 751 and the cleaning gas would proceed at a slower rate, thus increasing the amount of time required to clean the chamber components and the showerhead surface 778A. The cleaning plate 230 contains the cleaning gas near the showerhead assembly 204 in order to increase the amount of time the cleaning gas is in contact with the deposited material 751. Furthermore, the turbulence provided by the turbulence-inducing structures 375a-375d allows the cleaning gas to more efficiently clean the showerhead assembly 204, thereby reducing cleaning time and extending the time required between cleans. In one example, utilization of the cleaning plate 230 extends the mean time between preventative maintenance cleanings from about 10 deposition cycles to about 60 depositions cycles, thus reducing chamber downtime.

FIGS. 8A-8G are schematic views of cleaning plates according to other embodiments of the invention. While the cleaning plate described above includes openings therethrough, the cleaning plates described hereafter generally include plate-like bodies which do not have holes therethrough. Thus, the cleaning plates described below need not be positioned on a carrier plate during a cleaning process.

FIG. 8A illustrates a cleaning plate 830A. The cleaning plate 830A includes a plate-like body having a bottom surface which is adapted to be disposed on a substrate support, and a top surface 836 opposite the bottom surface. The cleaning plate 830A has a ring 847 located around the perimeter of the top surface 836 of the cleaning plate 830A and extending perpendicularly therefrom. The ring 847 is adapted to act as a gas retaining ring for a cleaning gas during a cleaning process. Gas disturbers or turbulence-inducing structures 875A, such as ridges or bumps, are located on the top surface 836 of the cleaning plate 830A. The turbulence-inducing structures 875A are arranged as ridges radiating outward from the center of the cleaning plate 830A. The cleaning plate 830A is formed from an optically transparent material such as quartz or sapphire. However, it contemplated that the cleaning plate 830A may alternatively be formed from silicon carbide or another high emissivity material when it is desired that the cleaning plate 830A be able to directly absorb radiant energy.

FIG. 8B is a section view of the cleaning plate 830A along section line 8B-8B. The cleaning plate 830A includes a solid plate-like body with an upper surface 836 which does not have any holes therethrough. The turbulence-inducing structures 875A have a height less than the height of the ring 847, which promotes turbulent-mixing of a cleaning gas across the entire surface of the cleaning plate. The top surface of the ring 847 is generally positioned about 1 millimeter to about 4 millimeters from a surface of a showerhead assembly during a cleaning process. The ring 847 has a height of about 5 millimeters to about 10 millimeters, while the turbulence-inducing structures 875A have a height of about 1 millimeter to about 4 millimeters. However, it is contemplated that the heights and relative proportions of the ring 847, the turbulence-inducing structures 875A, and the spacing to the showerhead assembly may be adjusted in order to effect the desired amount of turbulent gas flow.

FIG. 8C illustrates a cleaning plate 830C which has turbulence-inducing structures 875C disposed on a cleaning plate surface 836. The turbulence-inducing structures 875C have a curved radial profile. The turbulence-inducing structures 875C spiral outward from a center of the cleaning plate surface 836 to the ring 847 located at a peripheral edge of cleaning plate 830C.

FIG. 8D illustrates a cleaning plate 830D which has turbulence-inducing structures 875D formed as elongated ridges on the cleaning plate surface 836. The turbulence-inducing structures 875C may form a pattern on the cleaning plate surface 836, or may be randomly distributed so long as the turbulence-inducing structures 875D are capable of inducing motion and redistribution of the cleaning gas. The turbulence-inducing structures 875D may or may not extend to the ring 847.

Figure 8E:
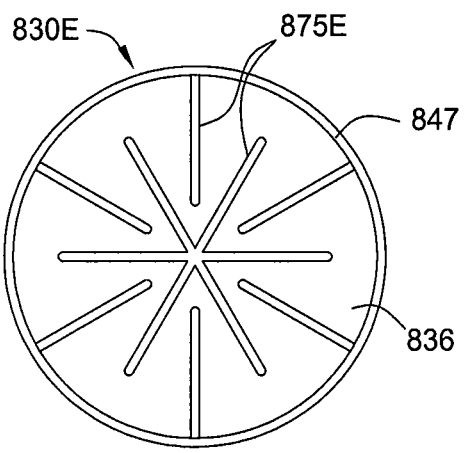

FIG. 8E illustrates a cleaning plate 830E which has turbulence-inducing structures 875E disposed on the cleaning plate surface 836. The turbulence-inducing structures 875E radiate centrally from the cleaning plate surface 836. Additional turbulence-inducing structures 875E contact the ring 847 and extend towards a center of the cleaning plate 830E.

Figure 8F:
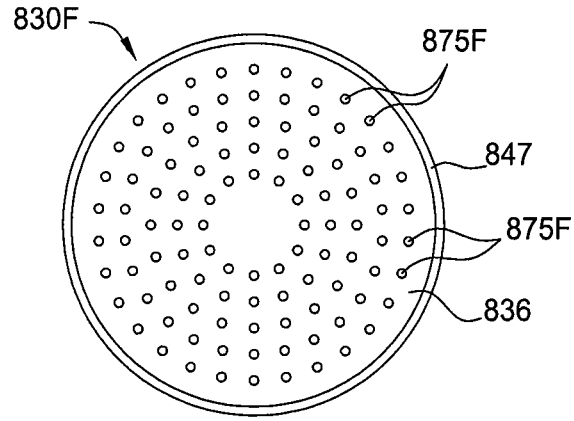

FIG. 8F illustrates a cleaning plate 830F which has turbulence-inducing structures 875F formed as dots or bumps and disposed on the cleaning plate surface 836. The dots or bumps may be randomly distributed on the cleaning plate surface 836, or may be formed into a shape or pattern, such as concentric circles or a spiral. The density and size of the turbulence-inducing structures 875F may be varied depending on the amount of turbulence desired.

Figure 8G:
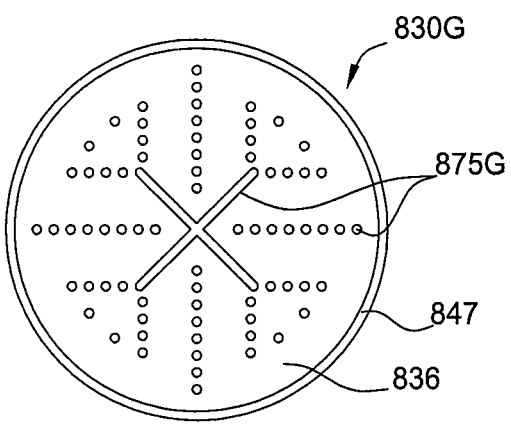

FIG. 8G illustrates a cleaning plate 830G which has both bumps and ridges used as turbulence-inducing structures 875G. Combinations of other features or structures can likewise be combined on a single cleaning plate. Other variations and combinations of turbulence-inducing structures or gas disturbers such as bumps, dots, ridges and fins are contemplated for inducing the redistribution of the cleaning gas, by imparting motion to the cleaning gas.

Although embodiments of the invention are generally described herein with reference to an MOCVD chamber, it is contemplated that other processing chambers may also benefit from embodiments of the invention. For example, it is contemplated that chambers for forming power electronics, chambers utilizing plasma cleaning, or chambers having resistive heaters therein may benefit from embodiments of the invention.

In summary, some of the benefits of the present invention include more efficient cleaning of a gas distribution showerhead. The cleaning plate and method of cleaning described herein reduce the cleaning time required to remove contaminants from the surface of a showerhead by inducing contact between a cleaning gas and material deposits. Also, the ring of the cleaning plate and the elevated cleaning position of the substrate support reduce the processing region, thus less cleaning gas is required to clean the showerhead, and expenses are saved on consumable materials. Furthermore, because the cleaning plate is sized similarly to a carrier plate, no additional handling equipment is required to implement the cleaning plate described herein. Also, since no additional handling equipment is required, the cleaning plate can be delivered to the processing chamber quickly, reducing the downtown required to clean a processing chamber or a showerhead located therein.

While the foregoing is directed to embodiments of the present invention, other and further embodiments of the invention may be devised without departing from the basic scope thereof, and the scope thereof is determined by the claims that follow.

We claim:

1. An apparatus for inducing turbulent flow within a processing chamber, comprising:
    a circular ring;
    a central hub located within the same plane as the circular ring; and
    a first set of turbulence-inducing structures extending between the central hub and the circular ring, wherein openings are located between each turbulence-inducing structure of the first set of turbulence-inducing structures, and wherein the turbulence inducing structures comprise an optically-transparent material.

2. The apparatus of claim 1, further comprising a second set of turbulence-inducing structures extending between the first set of turbulence-inducing structures and the circular ring.

3. The apparatus of claim 2, wherein the first set of turbulence-inducing structures and the second set of turbulence-inducing structures are located within the same plane as the circular ring and the central hub.

4. The apparatus of claim 3, wherein at least one sidewall of the first set of turbulence-inducing structures and the second set of turbulence-inducing structures is perpendicular to the plane.

5. The apparatus of claim 4, wherein the circular ring, the central hub, the first set of turbulence-inducing structures and the second set of turbulence-inducing structures comprise quartz.

6. The apparatus of claim 5, further comprising:
    a third set of turbulence-inducing structures extending between the central hub and the circular ring; and
    a plurality of footings extending from the third set of turbulence-inducing structures, wherein the footings have rounded ends and extend in a direction perpendicular to the plane.

7. An apparatus, comprising:
    a plate of optically transparent material;
    a ring disposed around a periphery of the plate; and
    a plurality of turbulence-inducing structures formed on a surface of the plate.

8. The apparatus of claim 7, wherein the optically transparent material comprises sapphire.

9. The apparatus of claim 7, wherein the optically transparent material comprises quartz.

10. The apparatus of claim 7, wherein the turbulence-inducing structures comprise a plurality of ridges radiating from a center of the plate.

11. The apparatus of claim 7, wherein turbulence-inducing structures comprise a plurality of bumps on the surface of the plate.

12. The apparatus of claim 7, wherein the plurality of turbulence inducing structures include ridges and bumps.

13. An apparatus for inducing turbulent flow within a processing chamber, comprising:
    a circular ring;
    a central hub located within the same plane as the circular ring, wherein the circular ring and the central hub comprise an optically-transparent material;
    a first set of turbulence-inducing structures extending between the central hub and the circular ring, wherein openings are located between each turbulence-inducing structure of the first set of turbulence-inducing structures; and
    a second set of turbulence-inducing structures extending between the first set of turbulence-inducing structures and the circular ring.

14. A processing chamber, comprising:
    a chamber body;
    a showerhead disposed within the chamber body;
    a substrate support disposed within the chamber body; and
    a cleaning plate disposed on the substrate support adjacent the showerhead, the cleaning plate comprising:
        a circular ring;
        a central hub located within the same plane as the circular ring; and
        a first set of turbulence-inducing structures extending between the central hub and the circular ring, wherein openings are located between each turbulence-inducing structure of the first set of turbulence-inducing structures, and wherein the turbulence inducing structures comprise an optically-transparent material.

* * * * *